(12) United States Patent  (10) Patent No.: US 6,341,903 B1
Ueda  (45) Date of Patent: Jan. 29, 2002

(54) SUBSTRATE PROCESSING APPARATUS

(75) Inventor: Issei Ueda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/589,454

(22) Filed: Jun. 8, 2000

(30) Foreign Application Priority Data

Jun. 9, 1999 (JP) .......................................... 11-162601

(51) Int. Cl.⁷ ................................................ G03D 5/00
(52) U.S. Cl. ........................ 396/611; 118/52; 427/240; 414/940
(58) Field of Search ................................ 396/604, 611; 29/25.01; 118/52, 56, 319–321, 500, 666–668; 355/30; 427/240; 414/935–941

(56) References Cited

U.S. PATENT DOCUMENTS

| 5,529,626 A | * | 6/1996 | Stewart ........................ 118/500 |
| 5,620,560 A | | 4/1997 | Akimoto et al. ............... 216/41 |
| 5,664,254 A | | 9/1997 | Ohkura et al. ............... 396/611 |
| 5,937,223 A | | 8/1999 | Akimoto et al. ............ 396/611 |
| 5,943,880 A | * | 8/1999 | Tateyama ..................... 62/434 |
| 6,215,545 B1 | * | 4/2001 | Matsuyama ................. 396/611 |

* cited by examiner

Primary Examiner—D. Rutledge
(74) Attorney, Agent, or Firm—Oblon, Spivak, McClelland, Maier & Neustadt, P.C.

(57) ABSTRACT

First, second, and third processing stations are connected to a cassette station into/out of which a wafer cassette is carried. Each of the processing stations is divided into a processing block including a processing unit for performing resist coating processing or developing processing and a second cooling section, and a transfer block including a wafer transfer unit, and heating section, and a first cooling section. The processing block has very precisely regulated atmosphere whose temperature is controlled. The wafer is very precisely controlled in temperature in the second cooling section and transferred to the processing unit in a very precisely regulated atmosphere so that a change in temperature during transfer is prevented and coating processing of a coating solution is performed while the temperature of the wafer is maintained very precisely.

8 Claims, 12 Drawing Sheets

SUBSTRATE PROCESSING APPARATUS

CROSS-REFERENCE TO RELATED APPLICATIONS

This application is based upon and claims the benefit of priority from the prior Japanese Patent Application No. 11-162601, filed Jun. 9, 1999, the entire contents of which are incorporated herein by reference.

BACKGROUND OF THE INVENTION

The present invention relates to a substrate processing apparatus, for example, for performing coating processing using a resist solution, developing processing, and the like for a substrate such as a semiconductor wafer, a glass substrate for a liquid crystal display, or the like.

In photolithography in a semiconductor device fabricating process, a semiconductor wafer (hereinafter referred to as a wafer) is coated with a resist, the coated resist is subjected to exposure processing in accordance with a predetermined pattern and then developing processing, whereby the predetermined pattern of resist film is formed. Such a series of processing is performed by a system in which an aligner is connected to a coating and developing apparatus.

FIG. 12 is a plan view showing a conventional example of such an apparatus, and a substrate cassette C housing 25 substrates, for example, semiconductor wafers is carried into a cassette stage 1 of a cassette station A1. A processing station A2 is connected to the cassette station A1, and an aligner not illustrated is connected to the processing station A2 with an interface station A3 between them.

A wafer W in the cassette C on the cassette stage 1 is taken out by a delivery arm 11, then sent to a coating unit 13 via a delivery section of a shelf unit 12, and coated with a resist there. Thereafter, the wafer W is transferred by the route of a main arm 14→a delivery section of a shelf unit 15→the interface station A3→the aligner, and exposed.

The exposed wafer W is transferred to the processing station A2 by the reverse route, developed in a developing unit not illustrated but provided at the lower tier of the coating unit 13, and then transferred by the route of the main arm 14→the delivery section of the shelf unit 12→the cassette C. Incidentally, each shelf of the shelf units 12, 15, and 16 is structured as a heating section, a cooling section, the aforesaid delivery section of the wafer W, or the like. Before and after the coating of the resist and before and after the developing processing, in order to perform each of the above processing at a predetermined temperature, heating and processing and cooling processing are performed in the shelf units 12, 15, and 16 in this order.

The processing station A2 is divided into a processing area composed of the coating unit and the developing unit and a transfer area in which the main arm 14 is disposed. The processing area has a very precisely regulated atmosphere and air from which impurities are removed and which is regulated at predetermined temperature and humidity is sent out thereto. The transfer area has a coarsely regulated atmosphere and air from which impurities are removed is sent out thereto.

Since the thickness of a resist film depends on the temperature during coating of a resist, it is required to apply the resist while the temperature of a wafer is regulated very precisely in this situation in which thinning of the resist film is promoted. Therefore, the present inventor observed that the temperature of the wafer W is regulated very precisely by performing two-stage cooling by means of two cooling sections. In other words, a first cooling section for cooling the wafer W heated to a predetermined temperature to a temperature not more than a first temperature, so to speak, for cooling the wafer W briefly and a second cooling section for subsequently cooling the wafer W to a second temperature lower than the first temperature while performing precise temperature control.

In this case, since there is no installation space in the processing area in the aforesaid layout, the second cooling section is provided in the transfer area. In such a layout, the wafer W passes through the transfer area with the coarsely regulated atmosphere, whose temperature and humidity are not regulated, while being transferred from the second cooling section to the coating unit 13. Therefore, even in the temperature of the wafer is very precisely regulated in the second cooling section, the temperature changes during subsequent transfer, and the temperature at the time of resist coating eventually comes to differ from an intended temperature. As a result, there is a possibility that uniformity of film thickness deteriorates.

To prevent the above possibility, it was considered that the processing station A2 has a very precisely regulated atmosphere whose temperature and humidity are regulated, but there is a disadvantage in that such enlargement of an area in which atmosphere regulation is performed causes an increase in cost.

BRIEF SUMMARY OF THE INVENTION

An object of the present invention is to provide a substrate processing apparatus capable of improving uniformity of processing by performing coating processing of a coating solution while the temperature of a substrate is very precisely regulated.

According to the present invention, there is provided a substrate processing apparatus comprising a heating unit configured to heat a substrate, a first cooling unit configured to cool the substrate heated by the heating unit to a temperature not more than a first temperature, a second cooling unit configured to cool the substrate cooled by the first cooling unit to a second temperature lower than the first temperature, a substrate processing unit configured to perform coating processing of a coating solution for the substrate cooled in the second cooling unit, and a substrate transfer unit configured to transfer the substrate between the first cooling unit, the second cooling unit, and the substrate processing unit, and wherein a processing station is divided into a processing block in which the temperature is controlled and a transfer block, the processing block including the substrate processing unit and the second cooling unit, and the transfer block including the substrate transfer unit, the heating unit and the first cooling unit.

The processing station may be coupled to a cassette station having a mounting unit on which a substrate cassette receiving a plurality of substrates is mounted and a delivery unit configured to deliver the substrate from/to the substrate cassette mounted on the mounting unit so that the substrate is transferred to the processing station by the delivery unit.

According to the aforesaid structure, since the substrate cooled to the second temperature by the second cooling unit is transferred to the substrate processing unit in a temperature-controlled atmosphere, the temperature of the substrate does not change during transfer. Consequently, coating processing using a coating solution can be performed with the temperature of the substrate being maintained with high precision, resulting in improvement in the uniformity of processing.

Further, a plurality of processing stations are connected to each other, and at least one of the processing stations may be structured so that a substrate transfer unit delivers the substrate from/to both of a substrate processing unit in its own processing station and another substrate processing unit in the adjacent processing station. In this case, the substrate delivered to one processing station is transferred to another substrate processing unit in the adjacent processing station if a substrate processing unit in the one processing station is occupied, thereby raising processing capacity and securing a high throughput.

In the aforesaid invention, a substrate processing unit and a second cooling unit exclusively used for the substrate processing unit may be provided, and the substrate processing unit and the second cooling unit may be disposed in the same atmosphere. Further, a dedicated transfer unit configured to transfer the substrate between the heating unit and the first cooling unit may be provided.

A substrate processing apparatus of the present invention can be applied to an apparatus for performing coating processing using a coating solution for a substrate. More specifically, at least one of the processing stations includes a substrate processing unit configured to perform coating processing using a resist solution for the substrate. An aligner is connected to a last processing station which is positioned at a last stage when counted from the cassette station and on a side opposite to the cassette station. A substrate processing unit in the last stage processing station performs developing processing for the substrate exposed by the aligner.

Additional objects and advantages of the invention will be set forth in the description which follows, and in part will be obvious from the description, or may be learned by practice of the invention. The objects and advantages of the invention may be realized and obtained by unit of the instrumentalities and combinations particularly pointed out hereinafter.

BRIEF DESCRIPTION OF SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
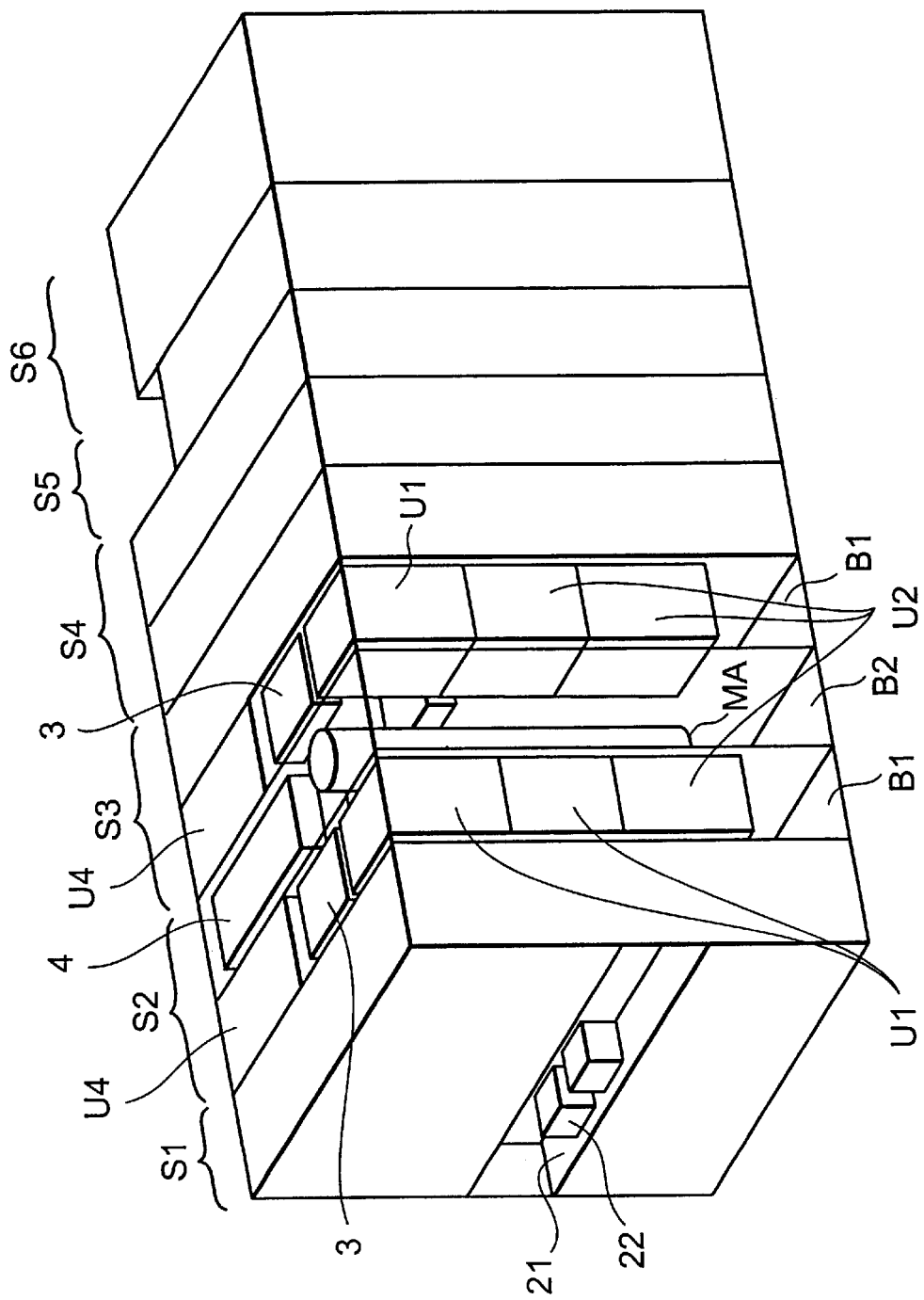
FIG. 1 is a general view showing a coating and developing apparatus according to an embodiment of the present invention.

A preferred embodiment in which the present invention is applied to a coating and developing apparatus for a substrate will be described below. FIG. 1 is a general view showing the inside of this embodiment in perspective. As shown in a schematic plan view of FIG. 2, S1 is a cassette station, and a plurality of, for example, three processing stations S2 to S4 are connected to the cassette station S1. If these three processing stations are referred to as a first processing station S2, a second processing station S3, and a third processing station S4 from the cassette station S1 side, an aligner S6 is connected to the third processing station S4 with an interface station S5 between them.

The cassette station S1 includes a cassette stage 21 on which wafer cassettes 22 (hereinafter referred to as "cassettes") are mounted and a delivery arm 23 or a delivery unit of the first processing station S2 which will be described later. For example, the wafer cassettes 22 may constitute four substrate cassettes each receiving a plurality of substrates, such as, 25 wafers W, and the delivery arm 23 may constitute a delivery unit for delivering the wafer W between the cassette 22 on the cassette stage 21 and a processing unit. The delivery arm 23 is structured to be ascendable and descendable, movable in an X-direction and a Y-direction, and rotatable around a vertical axis.

The first, second, and third processing stations S2, S3, and S4 have almost the same structure, and each station is divided into a processing block B1 including processing units constituting substrate processing sections and a transfer block B2 including a substrate transfer unit. The processing block B1 is arranged on the cassette station S1 side, and the transfer block B2 is arranged on the aligner S6 side. The cassette station S1 and the first station S2, respective processing stations S2, S3, and S4, the third processing station S4 and the interface station S5, the interface station S5 and the aligner S6, and the processing block B1 and the transfer block B2 of each of the processing stations S2, S3, and S4 are partitioned respectively by wall portions.

The structure of the interior of each of the processing stations S2, S3, and S4 is explained with reference to FIGS. 1, 2, 3 (a right side view of the first processing station S2), and 4 (a left side view of the first processing station S2) with the first processing station S2 as a representative. The processing block B1 includes processing units U each for performing coating processing using a coating solution for the wafer W and second cooling sections 3 each for cooling the wafer W to a second temperature. The transfer block B2 includes heating section each for heating the wafer W to a predetermined temperature, first cooling sections each for cooling the wafer W to a temperature not more than a first temperature which is higher than the second temperature, and a wafer transfer unit MA constituting a substrate transfer unit for transferring the wafer W. They are laid out so that the wafer W is transferred by the wafer transfer unit MA between the processing units U, the heating sections, the first cooling sections, and the second cooling sections 3.

First, an example of the layout of the inside of the processing block B1 will be explained. For example, three processing units U are arranged vertically on the right side in the processing block B1 as seen from the cassette station S1. In the first processing station S2, for example, two coating units U1 each for applying a resist being a coating solution to the wafer W and one antireflection film forming unit U2 for forming an antireflection film on the wafer W are allocated the processing units U. These units are arranged, for example, so that two coating units U1 are put on top of the antireflection film forming unit U2.

Figure 5:
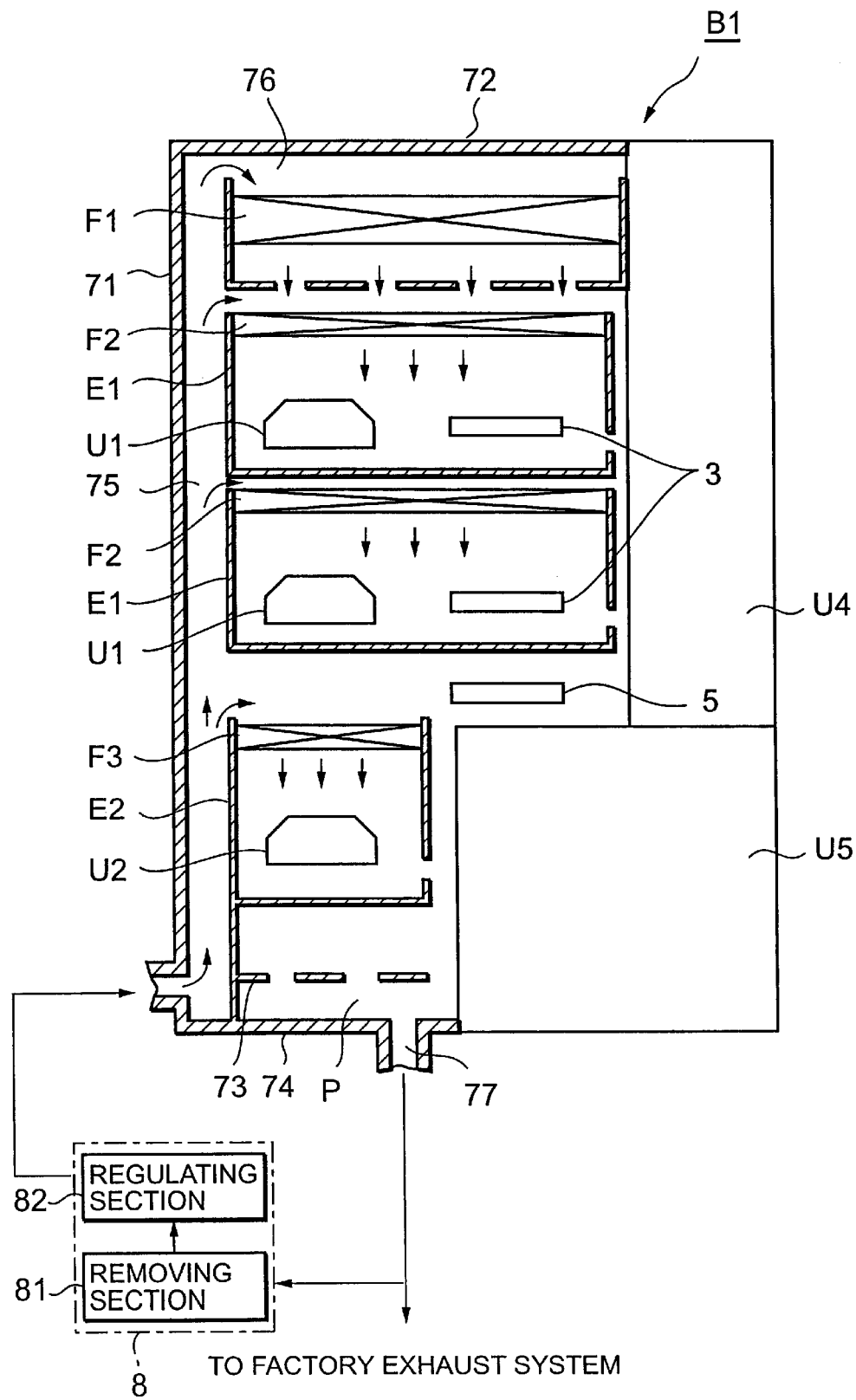
FIG. 5 is a sectional view showing an example of a processing block.

Vertically arranged on the left side of these processing units U are, for example, two of the second cooling sections 3. Each of the second cooling sections 3 is provided corresponding to the coating unit U1 in the same atmosphere as the coating unit U1 as shown in FIG. 5 (a sectional view of the processing block B1 as seen from the aligner S6 side), and a delivery table 5 provided with a delivery section, for example, for delivering the wafer W between the delivery arm 23 of the cassette station S1 and the wafer transfer unit MA is provided under the second cooling sections 3.

Figure 2:
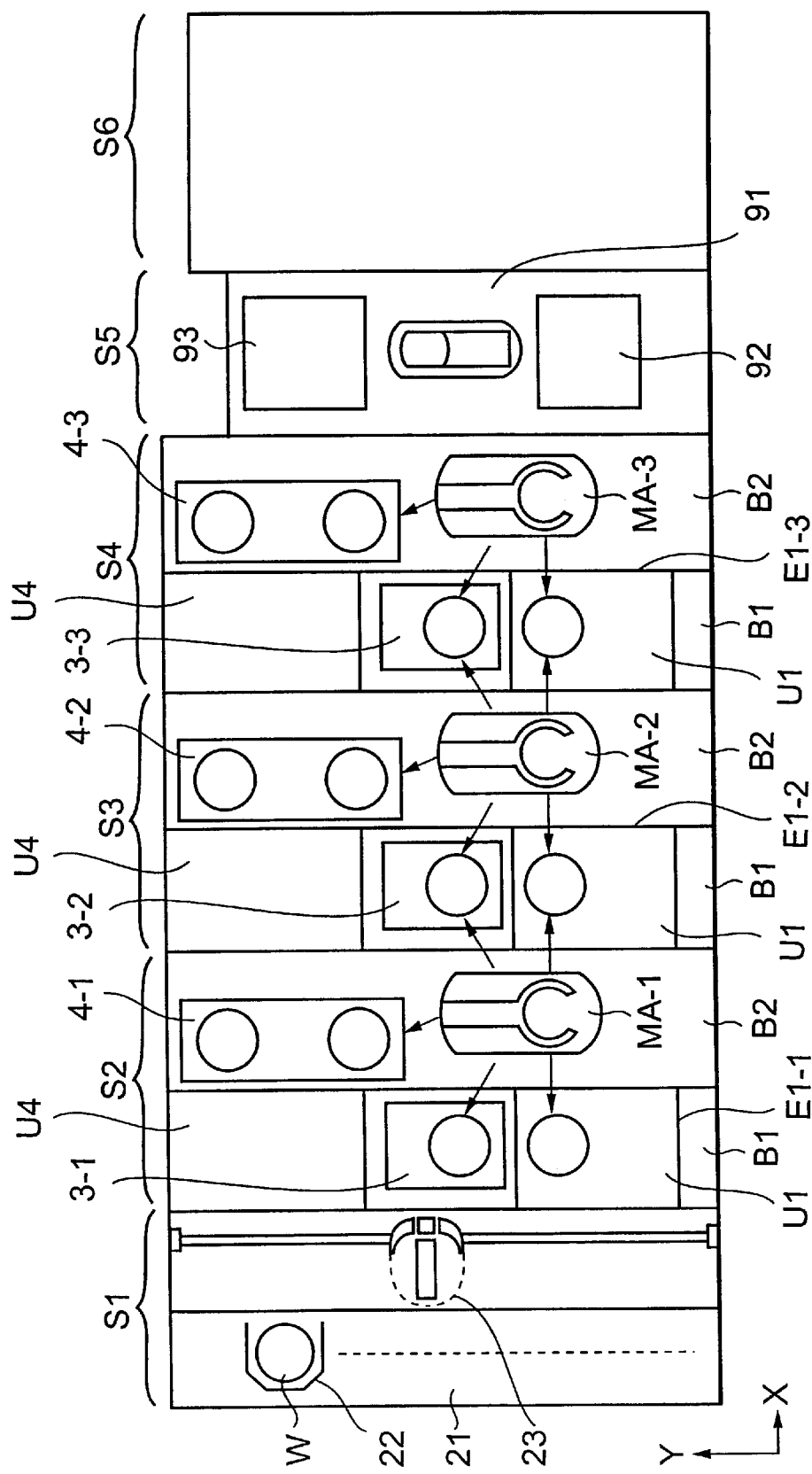
FIG. 2 is a schematic plan view showing the coating and developing apparatus.
Figure 6:
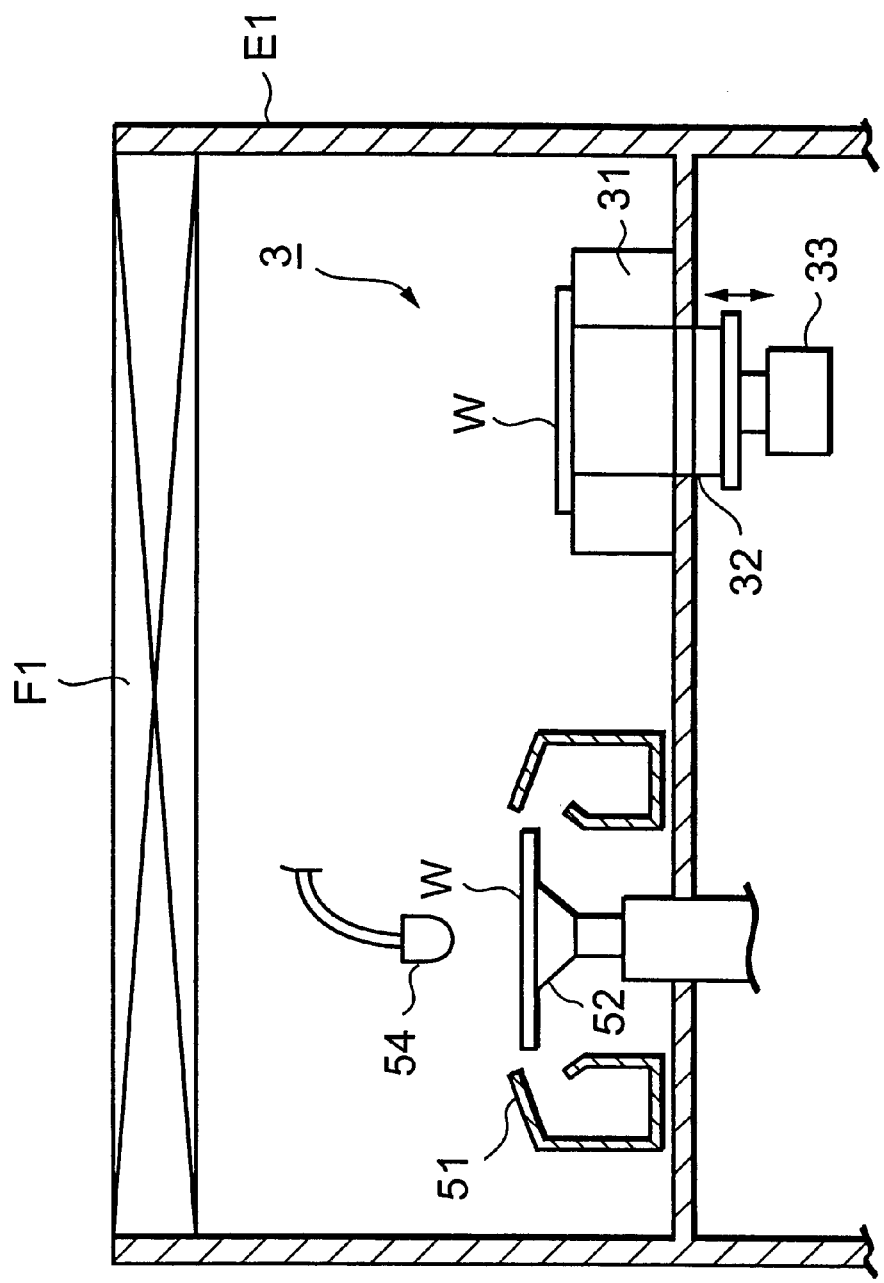
FIG. 6 is a sectional view showing an example of a processing chamber housing a coating unit and a second cooling unit.

Although not illustrated in FIG. 1 and FIG. 2 for convenience, the second cooling section 3 and the coating unit U1 are housed in one processing chamber E1, as shown in FIG. 6, for example. The second cooling section 3 is structured to mount the wafer W on the upper face of a chill plate 31 provided with a refrigerant channel therein and controlled at a predetermined temperature and to cool the wafer W to the second temperature which is lower than the first temperature. The numeral 32 in FIG. 6 is an ascent/descent pin, raised and lowered by a raising and lowering mechanism 33, for receiving and passing the wafer W from/to the from face of the chill plate 3.

Figure 7:
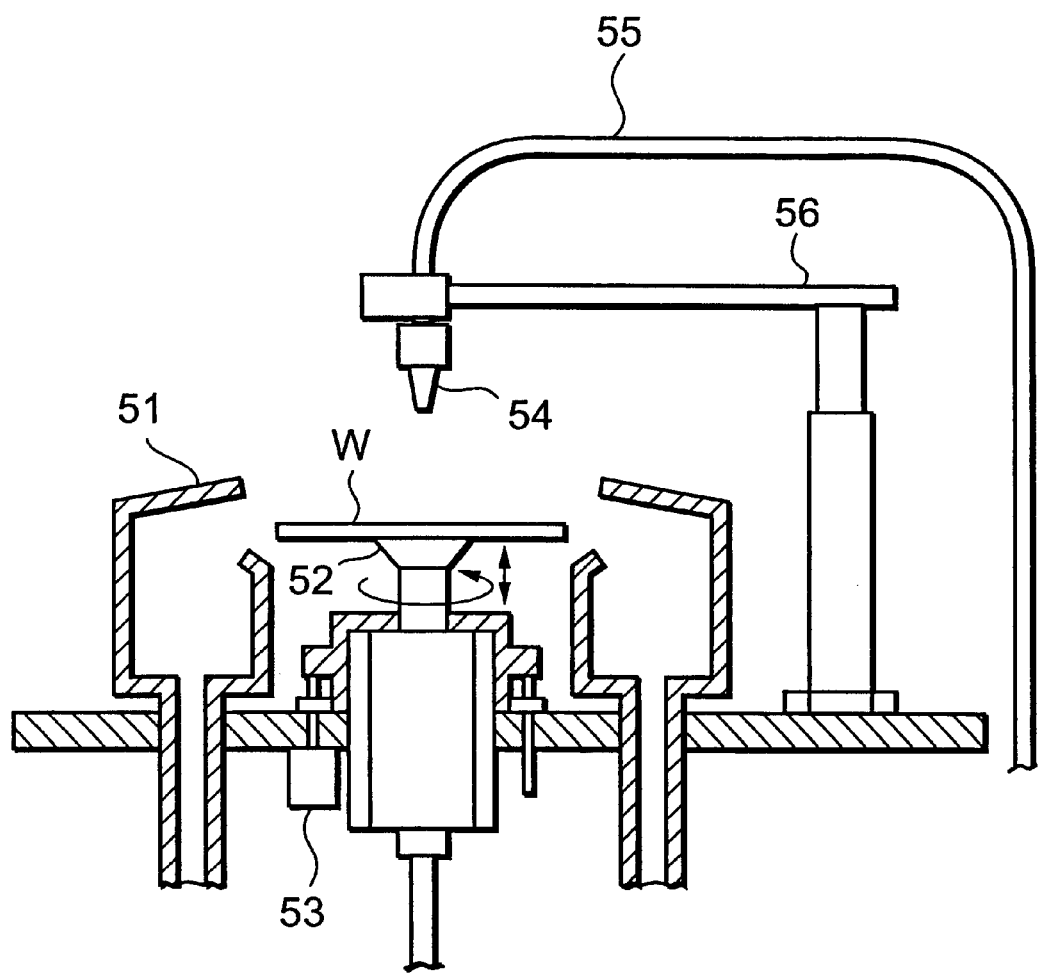
FIG. 7 is a sectional view showing the coating unit.

When the coating unit U1 is explained, for example, based on FIG. 7, the numeral 51 is a cup, and a rotatable spin chuck 52 having a function of vacuum suction is provided in the cup 51. The spin chuck 52 is structured to be ascendable and descendable by means of a raising and lowering mechanism 53, and when the spin chuck 52 is positioned at the upper side of the cup 51, the delivery of the wafer W from/to an arm 61 of the wafer transfer unit MA is performed.

As for the delivery of the wafer W, the arm 61 reaches a position above the spin chuck 52, and the spin chuck 52 relatively rises from the lower side thereof and receives the wafer W on the arm 61, while the wafer W is delivered from the spin chuck 52 side to the arm 61 by operation reverse to the above. The coating unit U1 includes a discharge nozzle 54, a resist solution supply pipe 55 and a supporting arm 56 for horizontally moving the nozzle. In such a coating unit U1, a resist solution as a coating solution is dropped from the discharge nozzle 54 to a point near the center of the front face of the wafer on the spin chuck 52, and spread and applied over the wafer W by rotating the spin chuck 52.

Figure 8:
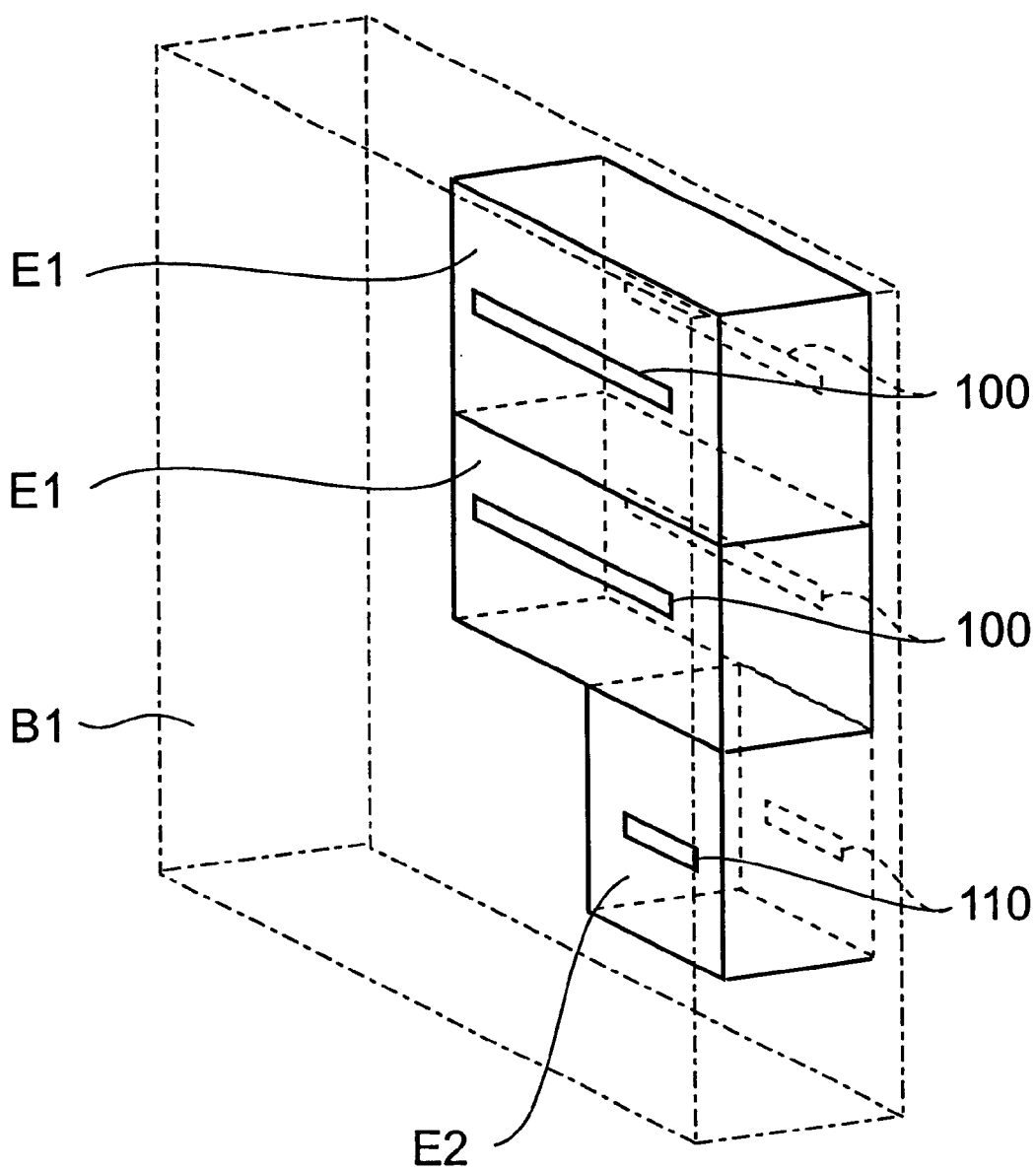
FIG. 8 is a perspective view showing an example of the processing chamber housing the coating unit and the second cooling unit.

As shown in FIG. 8, for example, in each of the processing chamber E1, carrying in/out ports 100 for the wafer W are formed at positions corresponding to the transfer arm 61 of the wafer transfer unit MA, which will be described later. The wafer W can be delivered to the second cooling section 3 and the coating unit U1 by the wafer transfer unit MA, and the wafer W cooled in the second cooling section 3 is immediately transferred to the coating unit U1 by the wafer transfer unit MA.

The aforesaid antireflection film forming unit U2 has the same structure as the coating unit U1 and it is, for example, individually housed in a processing chamber E2. The wafer W is transferred by the wafer transfer unit MA through carrying in/out ports 110 (See FIG. 8) for the wafer W formed in the processing chamber E2.

Figure 4:
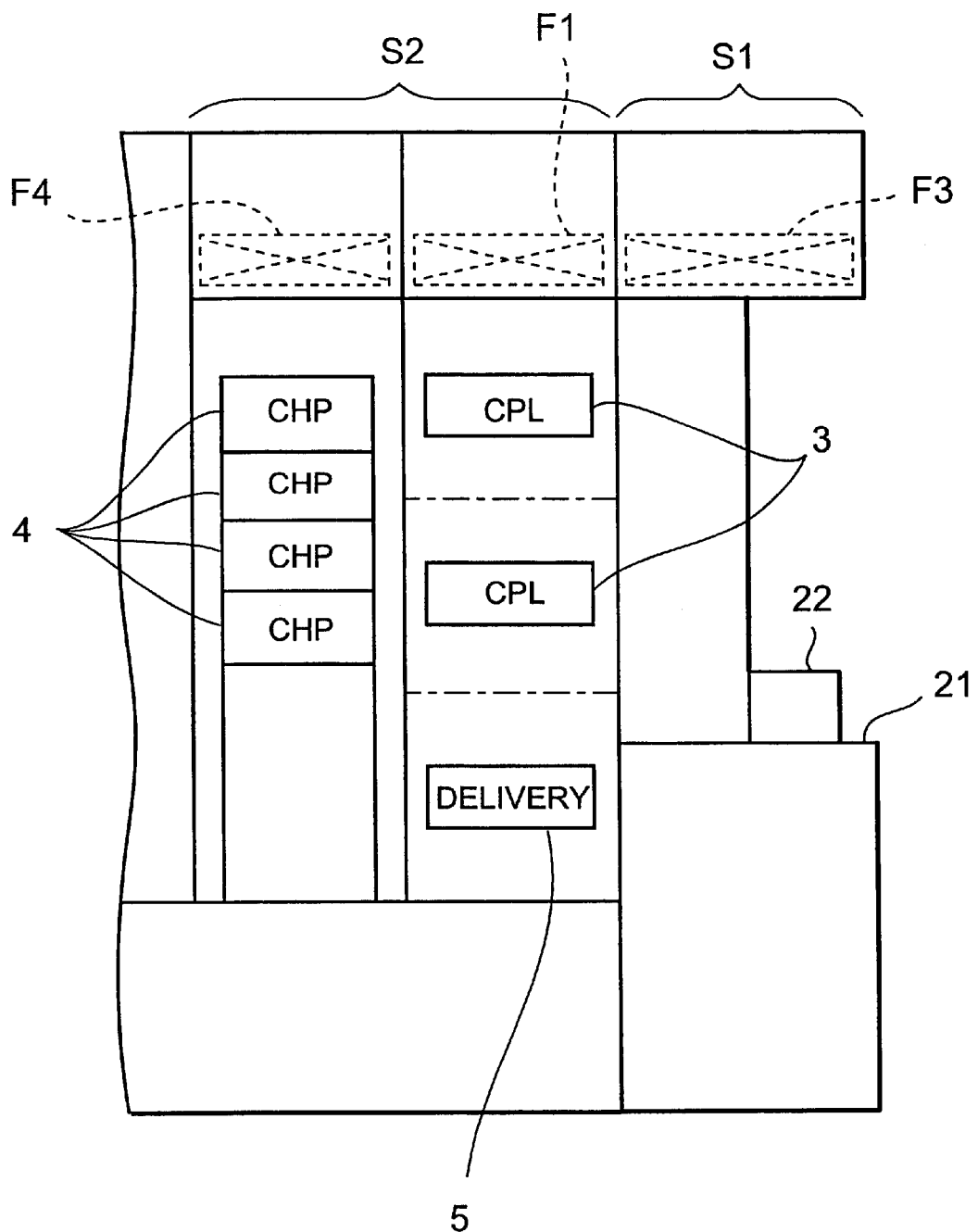
FIG. 4 is a schematic left side view showing the coating and developing apparatus.

The left side of the second cooling sections 3 as seen from the cassette station S1 is allocated to an electric unit U4 including a power supply section for drive systems of the wafer transfer unit MA and the processing units U, which will be described later, a controller for controlling electric power for the above units, and electrical equipment such as a switchboard for distributing electric power among the above units. The left side of the antireflection film forming unit U2 as seen from the cassette station S1 at the bottom of the electric unit U4 is allocated to a chemical unit U5 for housing a supply system of supplying chemicals to the coating units U1 and the antireflection film forming unit U2. The chemical unit U5 houses storage tanks for a solvent, a resist solution, and the like, drive sections for various kinds of valves such as on-off valves of the storage tanks and the like and filters, drive systems for the discharge nozzles, and the like. Incidentally, the processing block B1 in FIG. 4 shows the right portion of the electric unit U4 and the chemical unit U5 as seen from the cassette station S1.

As concerns one example of the layout of the inside of the transfer block B2, the wafer transfer unit MA is provided at the back of the processing units U and the second cooling sections 3 as seen from the cassette station S1. A plurality of, for example, four CHP (Chilling Hot Plate Process Station) units 4 each including a heating section and a first cooling section are vertically arranged on the left side of the wafer transfer unit MA as seen from the cassette station S1.

Figure 9:
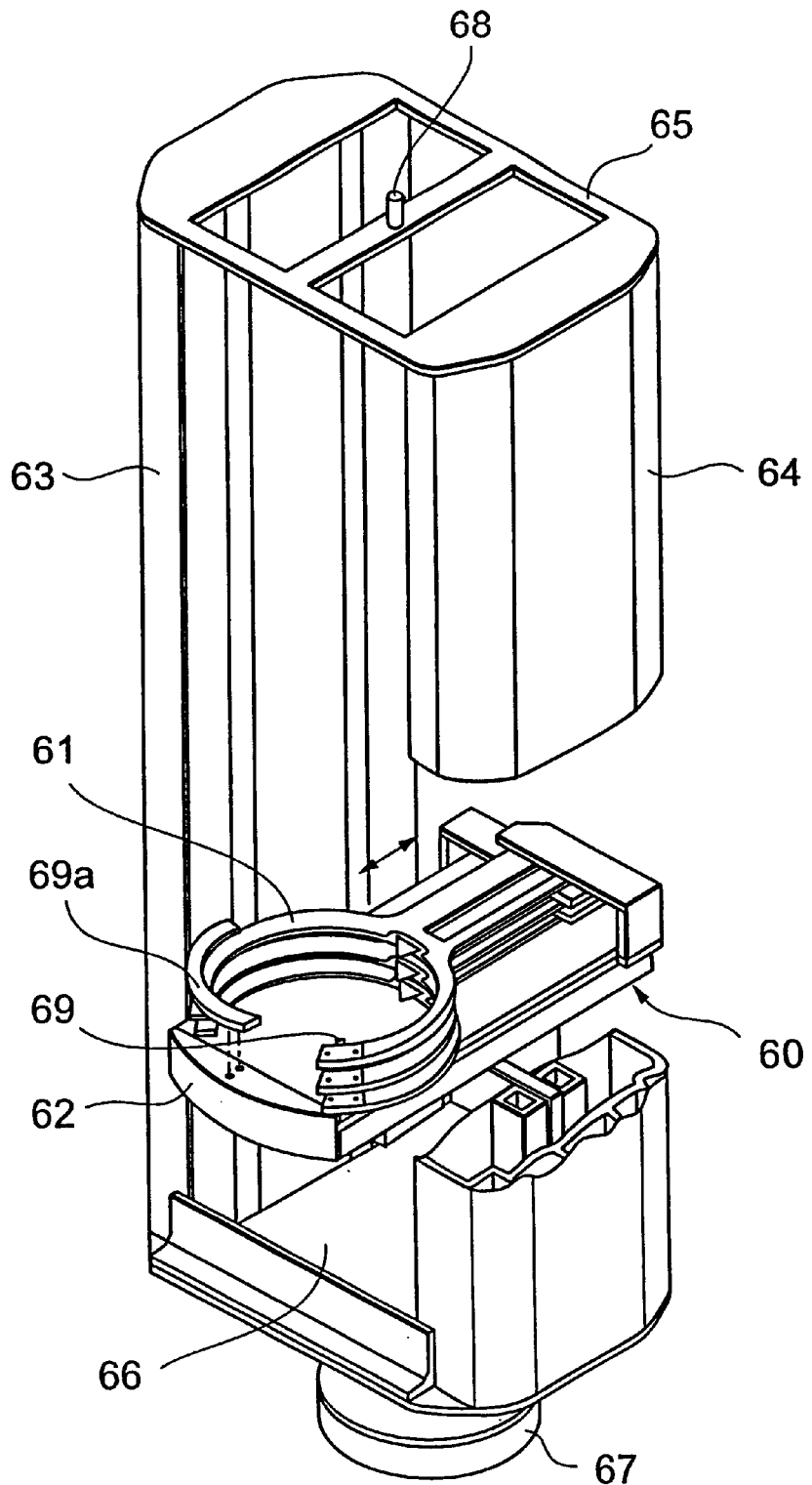
FIG. 9 is a perspective view showing a wafer transfer unit.

As shown in FIG. 9, for example, the wafer transfer unit MA includes an arm 61 for holding the wafer W, a base 62 for supporting the arm 61 so that the arm can freely move forward and backward, a pair of guide rails 63 and 64 for ascendably and descendably supporting the base 62, coupling members 65 and 66 respectively for coupling the upper ends and the lower ends of the guide rails 63 and 64, a rotational drive portion 67 integrally attached to the coupling member 66 at the lower ends of the guide rails for driving a frame body constituted by the guide rails 63 and 64 and the coupling members 65 and 66 so that the frame body can freely rotate around a vertical axis, and a rotating shaft portion 68 provided on the coupling member 65 at the upper ends of the guide rails.

The arm 61 has a three-stage structure so as to hold the wafer W on each stage, and the peripheral edge of the wafer W is placed on each of, for example three claw portions 69 provided at respective stages. A base end portion of the arm 61 can move sliding along a guide groove 60 provided in the longitudinal direction of the base 62. The forward and backward movement of the arm 61 by the sliding movement is drive-controlled by a drive unit not illustrated. The ascending and descending movement of the base 62 is drive-controlled by a drive unit not illustrated. The ascending and descending movement of the base 62 is drive-controlled by another drive unit not shown. Hence, these two drive units (not shown), guide groove 60, guide rails 63 and 64, and rotational drive portion 67 comprise a drive section for driving the arm 61 so that the arm can freely rotate around the vertical axis and freely move ascendably and descendably, and forward and backward. Incidentally a sensor supporting member 69a is provided with a photosensor for detecting the presence or absence of the wafer W on the arm 61 and is fixed by the base 62.

The CHP unit 4 will be explained briefly referring to FIGS. 10A to 10D. Provided inside a processing chamber 41 are a hot plate 42 constituting the heating section for mounting and heating the wafer thereon, a chill plate 43 constituting the first cooling section for mounting and cooling the wafer W thereon, and a dedicated transfer unit 44, attached under the chill plate 43, for transferring the chill plate 43 between a position above the hot plate 42 and a position adjacent to the hot plate 42. In this example, when seen from the cassette station S1, the chill plate 43 is disposed on the left side of the wafer transfer unit MA and the hot plate 42 is disposed on the left side of the chill plate 43.

Figure 10A:
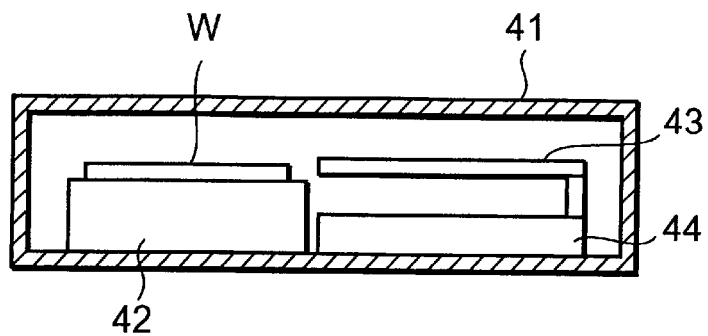
FIGS. 10A to 10D are sectional views showing an example of a CHP unit.
Figure 10B:
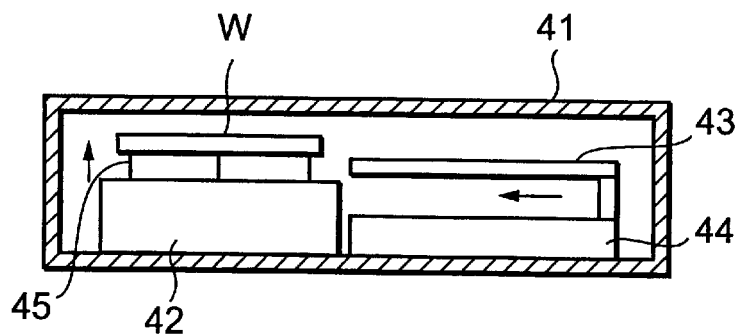
Figure 10C:
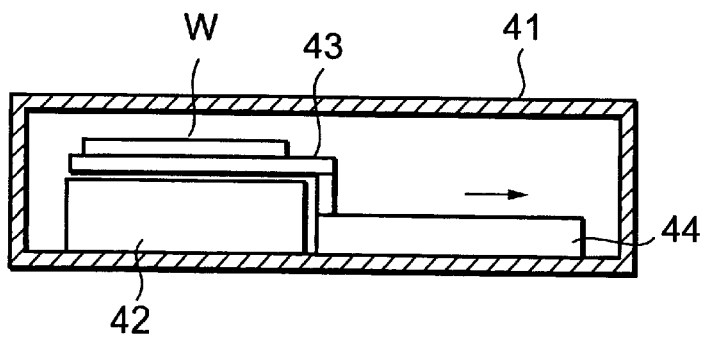
Figure 10D:
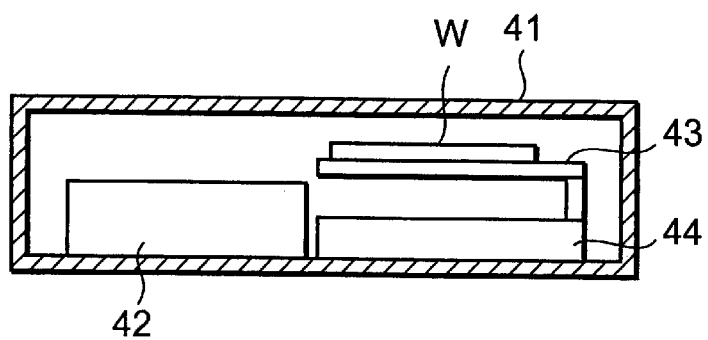

In this CHP unit, for example, as shown in FIG. 10A, the wafer W is mounted on the hot plate 42 and heated. Subsequently, as shown in FIGS. 10B and 10C, a protruding pin 45 put in the hot plate 42 is raised to lift the wafer W off the hot plate 42, and then the chill plate 43 is moved to the hot plate 42 side and positioned below the wafer W by the transfer unit 44, and concurrently the protruding pin 43 is lowered to deliver the wafer W to the chill plate 43. Thereafter, as shown in FIG. 10D, the chill plate 43 is withdrawn to its original position to cool the wafer W. In some cases, cooling is performed at a position shown in FIG. 10C. In this example, the transfer unit 44 corresponds to a dedicated transfer unit for transferring the wafer W between the hot plate 42 and the chill plate 43.

Figure 11:
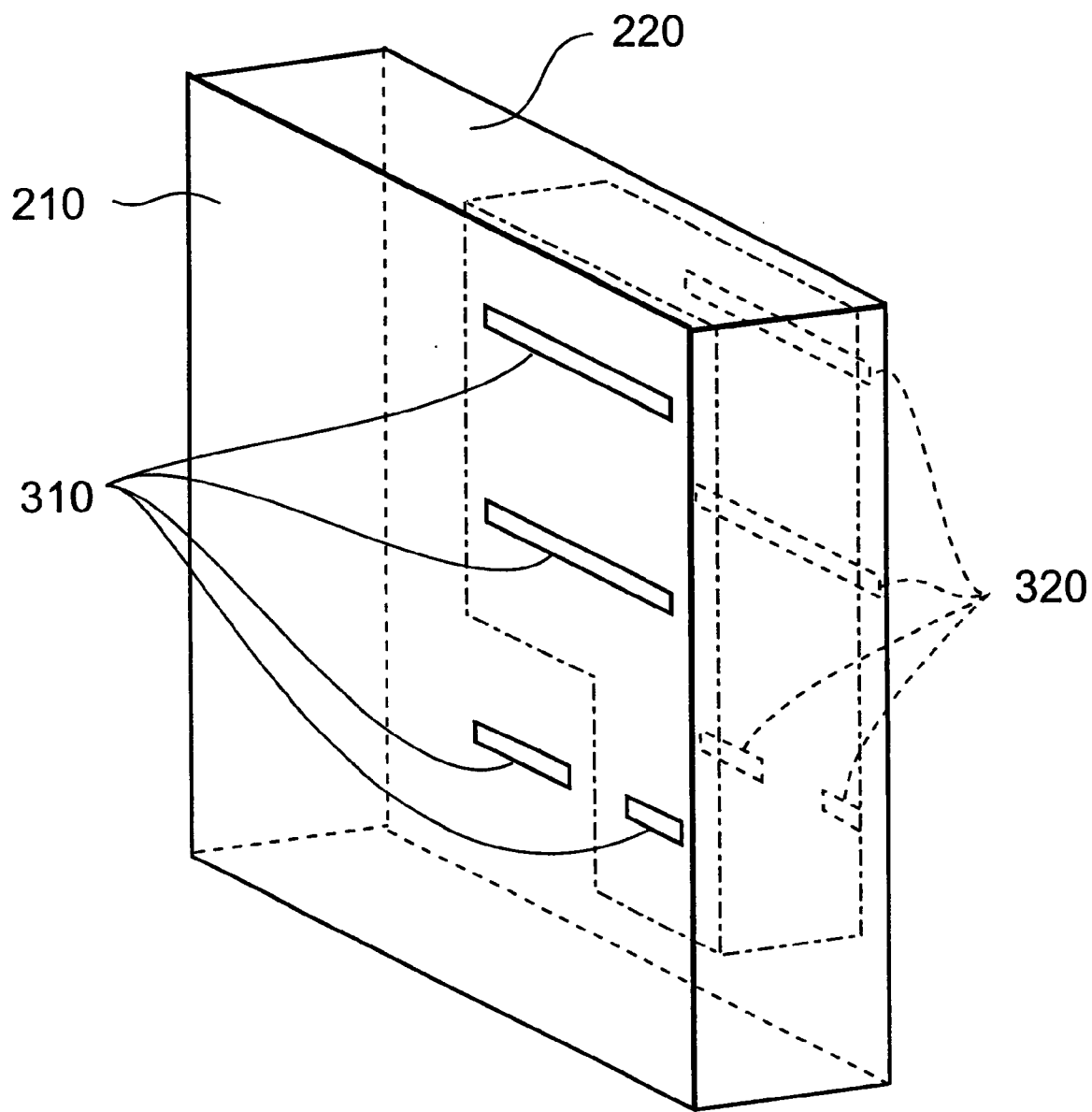
FIG. 11 is a perspective view showing an example of the processing block.
Figure 12:
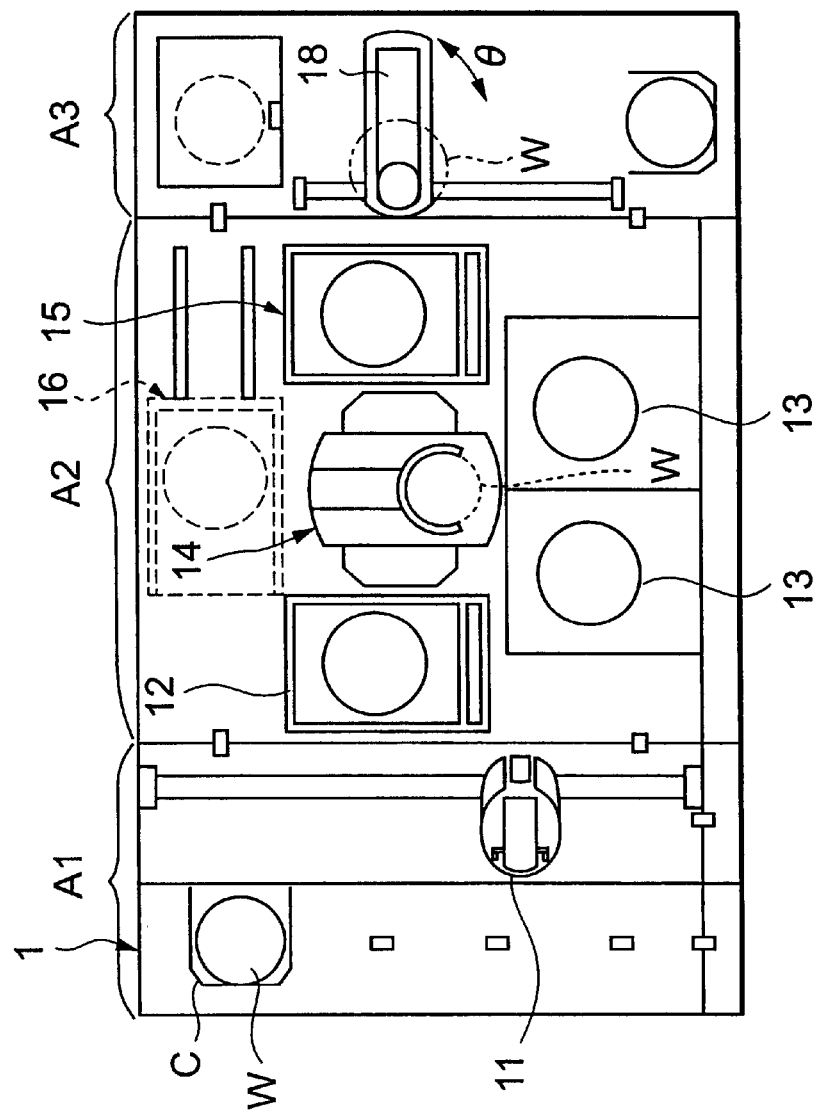
FIG. 12 is a schematic plan view showing a conventional coating and developing apparatus.

The cassette station S1 and the processing block B1, and the processing block B1 and the transfer block B2 are partitioned off respectively by wall portions 210 and 220, for example, as shown in FIG. 11 with the processing block B1 as a representative. Through delivery ports 310 and 320 formed in the wall portions 210 and 220 for the delivery arm 23 and the arm 61 of the wafer transfer unit MA, the wafer W is transferred between the delivery arm 23, and the antireflection film forming unit U2 and the delivery table 5, and between the wafer transfer unit MA and the coating unit U1, the antireflection film forming unit U2, and the second cooling section 3.

The processing block B1 is enclosed by a side wall 71 as shown in FIG. 5, for example, and provided with a top plate 72 at the top thereof and a base plate 74 at the bottom thereof with a space P between the base plate and a vent hole plate 73. A wall duct 75 is formed on one side of the processing block Bi and communicates with a ceiling chamber 76 formed on the lower face side of the top plate 72.

An exhaust port 77 is formed in the base plate 74, and a lower atmosphere in the processing block B1 collected through the vent hole plate 73 is exhausted from the exhaust port 77 to a factory exhaust system, while a part thereof is introduced into a filter device 8 as an impurity removing device. Air cleaned in the filter device 8 is sent out to the wall duct 75 and blown out as down-flowing air into the processing block B1 via a filter unit F1 provided under the ceiling chamber 76.

Filter units F2 and F3 are also provided in ceiling portions of the processing chamber E1 housing the coating unit U1 and the processing chamber E2 housing the antireflection film forming unit U2 and communicate with the wall duct 75 respectively. Thus, the cleaned air flowing through the wall duct 75 is discharged into the processing chambers E1 and E2 via the filter units F2 and F3 as down-flowing air.

The filter device 8 includes an impurity removing section 81 for removing impurities, and sending out air. For example, impurities may be removed by gas-liquid contact caused by spraying pure water which is an impurity removing liquid and a regulating section 82. Regulating section 82 may be provided with a heating mechanism and a humidifying mechanism for regulating air from which impurities are removed at predetermined temperature and humidity. As described above, the air from which impurities are removed and which is regulated on predetermined temperature and humidity conditions by the filter device 8 is sent out into the processing block B1, whereby an atmosphere inside the block B1 is set on the predetermined temperature and humidity conditions, resulting in a so-called very precisely regulated atmosphere.

Figure 3:
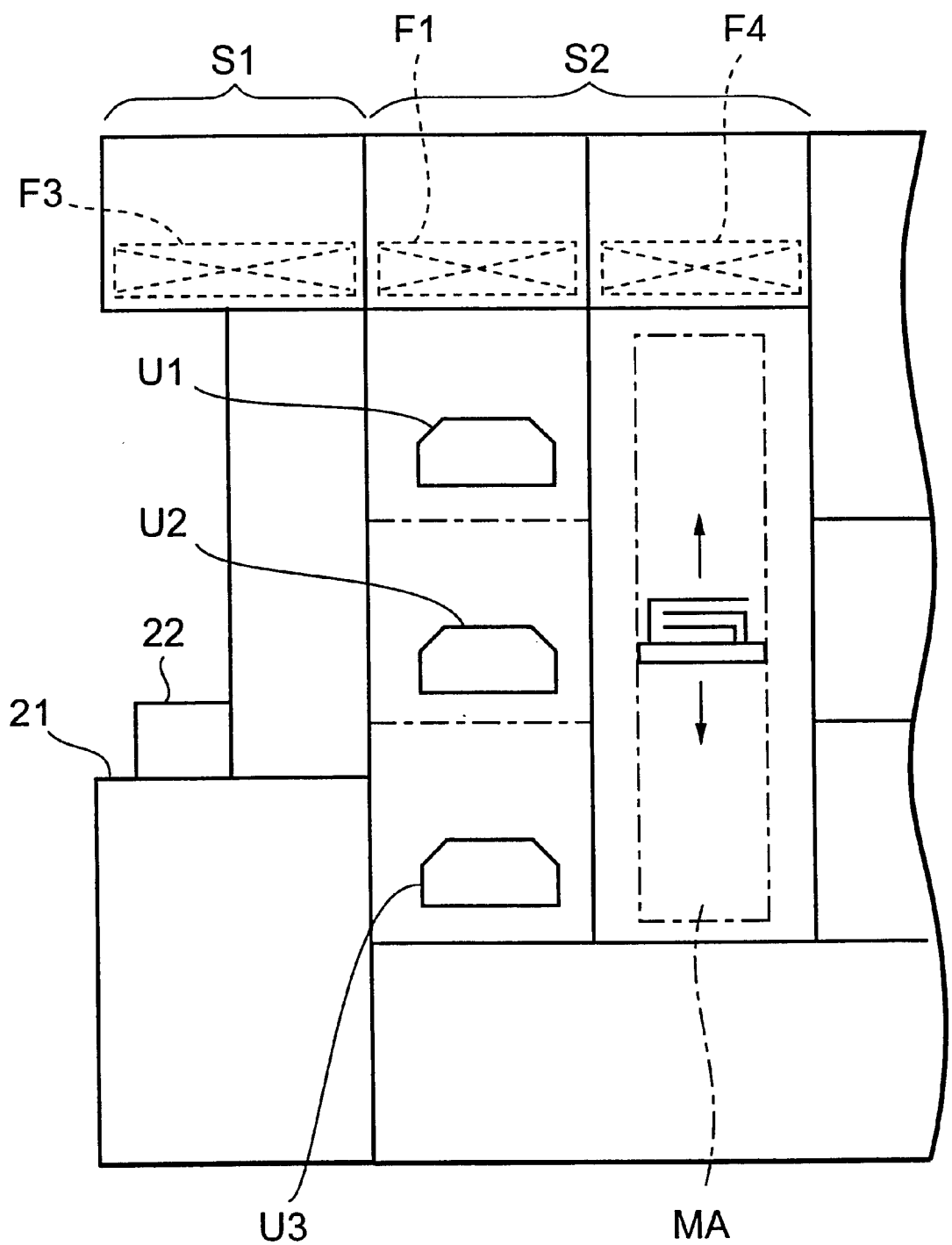
FIG. 3 is a schematic right side view showing the coating and developing apparatus.

Meanwhile, the cassette station S1 and the transfer block B2 also include filter units F3 and F4 at the upper portions thereof respectively likewise with the processing block B1 (see FIG. 3 and FIG. 4). Air from which impurities are removed is discharged as down-flowing air from ceiling portions. The point in which they differ from the processing block B is that the temperature and humidity of air are not regulated. In this point, an atmosphere inside the transfer block B2 is a so-called coarsely regulated atmosphere for which the temperature and humidity conditions are not set.

The second processing station S3 has the same structure including the layout of arrangement of respective sections except that one coating unit U1 and two antireflection film forming units U2, for example, are allocated the processing units U.

The third processing station S4 has the same structure as the first and second processing stations S2 and S3 including the layout of arrangement of respective sections except that three developing units U3, for example, are allocated the processing units U. In this case, for example, the second cooling section 3 is provided corresponding to the developing unit U3, and both are housed in the same processing unit E1. The delivery table 5 provided with a delivery section for the wafer w is disposed under the second cooling section 3. The developing unit U3 is to apply a developing solution being a coating solution to the exposed wafer W and perform developing, and has almost the same structure as the coating unit U1, but the discharge nozzle 54 includes a large number of supply ports arranged in the direction of the diameter of the wafer W. The developing solution is heaped up, for example, by rotating the spin chuck 52 a half turn while the developing solution is being dropped from the discharge nozzle 54 to a point near the center of rotation of the front face of the wafer, whereby developing is performed.

Further, the filter unit F1 of the processing block B1 of the third processing station S4 includes a filter for cleaning air, a chemical filter to which acid components are added to remove alkaline components in the air such as ammonia components and amine, and the air which is cleaned, from which alkaline components are removed, and which is regulated at predetermined temperature and humidity is sent out into an under processing space. When a chemically amplified resist is used as a resist solution, for example, it is required to prevent entry of alkaline components into a developing processing atmosphere. Therefore, the interior of the processing block B1 is made a closed space and the entry of alkaline components from the outside is prevented by using the chemical filter.

Acids are produced by exposing the chemically amplified resist, and the acids are diffused by heat processing and act as catalyst, and as a result, decompose base resin which is the main component of a resist material or change its molecular structure to make it soluble in the developing solution. Accordingly, in the case where this kind of resist is used, when alkaline components such as a very small amount of ammonia contained in air or amine produced from paint on walls come in contact with acids on the surface portion of the resist, a catalytic reaction by the acids is suppressed, thus deteriorating the shape of a pattern. Consequently, the removal of alkaline components is needed.

In the first, second, and third processing stations S2, S3, and S4, the processing block B1 of the second processing station S3 is connected adjacent to the transfer block B2 of the first processing station S2, and the processing block B1 of the third processing station S4 is connected adjacent to the transfer block B2 of the second processing station S3. In this case, the wafer transfer unit MA of the first processing station S2 is structured to be able to perform the delivery (access) of the wafer W not only for the processing units U and the second cooling sections 3 of its own processing station S2 but also for the processing units U and the second cooling sections 3 of the adjacent second processing station S3. The wafer transfer unit MA of the second processing station S3 is structured to be able to perform the delivery of the wafer W not only for the processing units U and the second cooling sections 3 of its own processing station S3 but also for the processing units U and the second cooling sections 3 of the adjacent third processing station S4.

Here, for facilitating explanation, the numerals and symbols of the processing chamber E1 housing the processing unit U and the second cooling section 3, the wafer transfer unit MA, and the CHP unit of the first processing station S2 are represented by E1-1, Ma-1, and 4-1 respectively. The numerals and symbols of the processing chamber E1 housing the processing unit U and the second cooling section 3, the wafer transfer unit MA, and the CHP unit of the second processing station S3 are represented by E1-2, MA-2, and 4-2 respectively. The numerals and symbols of the processing chamber E1 housing the processing unit U and the second cooling section 3, the wafer transfer unit MA, and the CHP unit of the third processing station S4 are represented by E1-3, MA-3, and 4-3 respectively.

In the processing chamber E1-2, transfer ports (not illustrated) are formed in areas corresponding to the wafer transfer unit MA-1 and MA-2. Similarly, in the processing chamber E1-3, transfer ports (not shown) are formed in areas corresponding to the wafer transfer units MA-2 and MA-3. As shown in FIG. 2, the delivery of the wafer W is performed for the processing chambers E1-1 and E1-2 by the wafer transfer unit MA-1, and the delivery of the wafer W is performed for the processing chambers E1-2 and E1-3 by the wafer transfer unit MA-2, which shows that if attention is given to the processing chamber E1-2 (E1-3), the wafer W can be delivered from both the transfer units MA-1 (MA-2) and MA-2 (MA-3).

The first, second, third processing stations S2, S3, and S4 are different in that the coating unit(s) U1 and antireflection film forming unit(s) U2 or the developing units U3 are allocated the processing units U and in the number of these units, but have the same structure. That is, the processing units U are provided, and the processing stations S2, S3, and S4 have the same structure.

Returning to the explanation of the entire apparatus, the interface station S5 is connected adjacent to the third processing station S4, and the aligner S6 for exposing the wafer W on which a resist film is formed is connected at the back of the interface station S5. The interface station S5 is provided with a delivery arm 91 for delivering the wafer W between the third processing station S4 and the aligner S6, a delivery table 92 including a delivery section of the wafer W, a peripheral aligner 93, and the like.

Thus, in the first, second, and third processing stations S2 to S4, the wafer W is delivered between the cassette station S1 and the interface station S5, and also in the first, second, and third processing stations S2 to S4, the wafer W is first heated to a predetermined temperature on the hot plate 42 of the CHP unit 4 and then cooled to a temperature not more than the first temperature on the chill plate 43, subsequently cooled to the second temperature in the second cooling section 3, and thereafter subjected to coating processing in the processing unit U.

Next, the operation of the aforesaid embodiment will be explained. First, the cassette 22 housing, for example, 25 wafers W is carried into the cassette stage 21 by an automatic transfer robot (or an operator), and one wafer W is taken out of the cassette 22 by the delivery arm 23 and transferred to the antireflection film forming unit U2 of the first processing station S2, where an antireflection film is formed on the front face of the wafer. The antireflection film is thus formed in order to reduce reflection caused on the lower side of the resist during exposure when the chemically amplified resist is used.

Subsequently, the wafer W is transferred to the hot plate 42 of the CHP unit 4-1 by the wafer transfer unit MA-1 and heated to a given temperature, for example, 100° C. to 200° C. Namely, the wafer W is heated to the given temperature by being mounted on the front face of the hot plate 42 maintained at the given temperature for a predetermined period of time.

Thereafter, the wafer W is transferred to the chill plate 43 in given timing as described above. At this time, the wafer W is delivered to the chill plate 43 in timing corresponding to heating period of the wafer W on the hot plate 42 by the transfer unit 44, thereby preventing over-bake of the wafer W.

The wafer W is cooled by being mounted on the front face of the chill plate 43 maintained at a given temperature for a predetermined period of time, and thus the wafer W is cooled to the first temperature, for example, 40° C. to 50° C. or lower. Subsequently, the wafer W is transferred to the second cooling section 3 in given timing by the wafer transfer unit MA-1. Also in this case, the wafer W is transferred to the wafer transfer unit MA-1 in timing corresponding to cooling period of the wafer W on the chill plate 43, thereby controlling the cooling period of the wafer W.

In the second cooling section 3, the wafer W is cooled by being mounted on the front face of the chill plate 31, and the wafer W cooled briefly on the chill plate 43 of the CHP unit 4-1 is cooled to the second temperature, for example, about 23° C. lower than the first temperature. On this occasion, the temperature of the chill plate 31 is controlled by a temperature control plate (not shown), and thus the wafer W is cooled to the second temperature while being controlled very precisely. The wafer W cooled as above is transferred to the corresponding coating unit U1 by the wafer transfer unit MA-1 and coated with a resist in the unit U1.

Subsequently, the wafer W is transferred by the route of the wafer transfer unit MA-1→the delivery table 5 of the second processing station S3→the wafer transfer unit MA-2→the delivery table 5 of the third processing station S4→the wafer transfer unit MA-3→the delivery table 92 of the interface station S5→the delivery arm 91→the aligner S6, and exposure of a circuit forming area is performed in the aligner S6.

The exposed wafer W undergoes exposure of the outer area of the circuit forming area in the peripheral aligner 93 of the interface station S5, and thereafter transferred to the third processing station S4 by the reverse route, and transferred by the route of the hot plate 42 of the CHP unit 4-3→the chill plate 43→the second cooling section 3→the developing unit U3 by the wafer transfer unit MA-3. After the wafer W is thus heated to a given temperature, for example, about 120° C. to 140° C. on the hot plate 42, the wafer W is briefly cooled to a temperature not more than the first temperature, for example, to 40° C. to 50° C. or lower on the chill plate 43 in order to prevent over-bake, then cooled to the second temperature lower than the first temperature, for example, to about 23° C. in the second cooling section 3-3 while the temperature of the wafer W is controlled very precisely, and thereafter developed in the developing unit U3.

The wafer W is then returned, for example, into the original cassette 22 via the wafer transfer unit MA-2→the delivery table 5 of the second processing station S3→the wafer transfer unit MA-1→the delivery table 5 of the first processing station S2.

When the delivery table 5 is not provided, the wafer W may be delivered from/to the cassette station S1, between the processing stations S2 to S4, and from/to the interface station S5 via the vacant antireflection film forming unit U2, coating unit U1, and the second cooling section.

In this case, the wafer W in the cassette station S1 is sent to the vacant antireflection film forming unit U2, CHP unit 4-1, second cooling section 3-1, and coating unit U1 of the first processing station S2 in sequence. However when these units and section are occupied, the wafer W is delivered to the vacant antireflection film forming unit U2, coating unit U1, CHP unit 4-2, and second cooling section 3-2 of the adjacent second processing station S3.

In the aforesaid embodiment, in the first and second processing stations S2 and S3, the coating units U1 and the second cooling sections 3 are provided in the processing block B1 with a precisely regulated atmosphere which is controlled on predetermined temperature and humidity conditions. Since the wafer W whose temperature is regulated in the second cooling section 3 is transferred to the coating unit U1 in the very precisely regulated atmosphere, the temperature of the wafer W does not change during the transfer from the second cooling section 3 to the coating unit U1 and thus the wafer W can be coated with the resist while the temperature of the wafer W is maintained very precisely. Consequently, uniformity of film thickness can be improved and high yield can be secured.

Similarly, when developing processing is performed as in the third processing station S4, the temperature of the wafer W does not change during the transfer from the second cooling section 3 to the coating unit U1. Thus, developing can be performed while the temperature of the wafer W is maintained very precisely. Consequently, the occurrence of uneven developing caused by a change in the temperature of the wafer can be prevented and high yield can be secured.

Further, each of the processing stations S2 to S4 is divided into the processing block B1 with a very precisely regulated atmosphere and the transfer block B2 with a coarsely regulated atmosphere. The processing units U such as the coating unit U1, the developing unit U3, and the like and the second cooling sections 3 only are disposed in the processing block B1. Therefore, an area in need of very precise temperature regulation favorably becomes small. As a result, costs required for regulating the atmosphere is low, and the management of atmosphere regulation becomes easy to perform.

Furthermore, the processing units U are vertically arranged in three stages, and the wafer w is transferred between the CHP unit 4, the second cooling section 3, and the processing unit U by the wafer transfer unit MA provided in the transfer block B2, thereby reducing the number of transfer units and hence downsizing the apparatus.

In this case, the substrate processing apparatus is such layout that the processing blocks B1 and the transfer blocks B2 are alternately disposed and that the wafer transfer unit MA is accessible to the processing units U and the like of the adjacent processing blocks B1 on both sides. Thus, the wafer W can be transferred to the vacant processing units U and the like sequentially, resulting in raising processing capacity and securing a high throughput.

Each of the processing stations S2 to S4 is divided into the processing block B1 and the transfer block B2. The processing block B1 is provided with the processing units U, the second cooling sections 3, the electric unit U4, and the chemical unit U5. The transfer block B2 is provided with the wafer transfer unit MA and the CHP units 4. Accordingly, there is offered advantages that each block is downsized and that fabrication is facilitated.

Moreover, a plurality of processing stations S2 to S4 are connected to each other, and these processing stations S2 to S4 have the same layout of the wafer transfer unit MA and the processing units U, so that the processing stations can be used for various purposes, thereby facilitating fabrication and assembling. Besides, the second cooling sections 3 and the CHP units 4 are housed in different blocks, and there exists the electric unit U4 in a portion adjacent to the hot plate 42 of each of the CHP units 4. Accordingly, the second cooling section 3 and the hot plate 42 are thermally separated. As a result, there is very little possibility that heat from the hot plate 42 exerts an influence on the second cooling section 3, and hence temperature control in the second cooling section 3 is facilitated.

Thus, the present invention allows the layout to be arranged in any way if the processing unit U and the second cooling section 3 are provided in the processing block B1, the wafer transfer unit MA, the heating section, and the first cooling section are provided in the transfer block B2, and the wafer W can be transferred by the route of the heating section→the first cooling section→the second cooling section 3→the processing unit U by the wafer transfer unit MA.

Further, three or more processing stations may be connected to each other, and three or more processing units U may be vertically arranged. The number of the coating units U1 and the developing units U3 can be arbitrarily set. Instead of putting the coating unit U1 and the antireflection film forming unit U2 in one processing station, it is suitable to disposed the coating unit U1 in one processing station and the antireflection film forming unit U2 in another processing station, or to put the coating unit U1 and the developing unit U3 in one processing station.

Furthermore, the second cooling section 3 common to a plurality of processing units U may be provided, and the number of the cooling sections 3 with respect to a plurality of processing units may be one. In addition, although the CHP unit is used in the aforesaid example, a structure in which the heating section, the first cooling section, and a dedicated transfer unit for transferring the wafer W between these sections are provided in the transfer block B2 is also suitable, or another structure in which the heating section and the first cooling section are provided and the wafer W is delivered to these sections by the wafer transfer unit MA is also suitable. Moreover, the processing unit U and the second cooling section 3 may be housed in separate processing chambers in the processing block B1.

Further, instead of forming an antireflection film on the front face of the wafer as in the aforesaid example, hydrophobic processing may be performed. In this case, the hot plate 42 is disposed in a closed space, for example, by dividing the hot plate 42 from the chill plate 43 of the CHP unit, and the wafer W is mounted on the hot plate 42 to undergo hydrophobic processing, subsequently cooled to a temperature not more than the first temperature on the chill plate 43 of CHP unit 4, thereafter cooled to the second temperature lower than the first temperature in the second cooling section 3, and then coated with the resist in the coating unit U1 while being very precisely regulated at the second temperature. The following processes are the same as in the aforesaid embodiment. Moreover, a substrate is not limited to the wafer, and a glass substrate for a liquid crystal display is also suitable.

As explained above, according to the present invention, the interior of a processing station is divided into a processing block including a substrate processing section and a second cooling section and a transfer block including a substrate transfer unit, a heating section, and a first cooling section, and the processing block has an atmosphere the temperature of which is controlled. Consequently, the temperature of a substrate can be very precisely maintained, thereby preventing the occurrence of ununiformity of processing in the substrate processing section caused by a change in temperature and securing high yield.

The accompanying drawings, which are incorporated in and constitute a part of the specification, illustrate presently preferred embodiments of the invention, and together with the general description given above and the detailed description of the preferred embodiments given below, serve to explain the principles of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus, comprising:

a heating section configured to heat a substrate;

a first cooling section configured to cool the substrate heated by said heating section to a temperature not more than a first temperature;

a second cooling section configured to cool the substrate cooled by said first cooling section to a second temperature lower than the first temperature;

a substrate processing section configured to perform coating processing of a coating solution for the substrate cooled in said second cooling section; and a first transfer unit configured to transfer the substrate between said first cooling section, said second cooling section, and said substrate processing section, wherein said substrate processing section and said second cooling section are arranged in a processing block whose temperature is controlled, and said first transfer unit, said heating section and said first cooling section are arranged in a transfer block, and said second cooling section is used exclusively for said substrate processing section.

2. The apparatus as set forth in claim 1, wherein said substrate processing section and said second cooling section are placed in the same atmosphere.

3. The apparatus as set forth in claim 1, further comprising a dedicated second transfer unit configured to transfer the substrate between said heating section and said first cooling section.

4. A substrate processing apparatus comprising:

a cassette station including a mounting section configured to mount a substrate cassette housing a plurality of substrates thereon and a delivery unit configured to deliver the substrate from/to the substrate cassette mounted on the mounting section; and a processing station connected to said cassette station and configured to process the substrate transferred by said delivery unit, said processing station including:

a heating section configured to heat the substrate;

a first cooling section configured to cool the substrate heated in said heating section to a temperature not more than a first temperature;

a second cooling section configured to cool the substrate cooled by said first cooling section to a second temperature lower than the first temperature;

a substrate processing section configured to perform coating processing using a coating solution for the substrate cooled by said second cooling section; and a substrate transfer unit configured to transfer the substrate between said first cooling section, said second cooling section, and said substrate processing section, said processing station being divided into a processing block whose temperature is controlled and a transfer block, said processing block including said substrate processing section and said second cooling section and said transfer block including said substrate transfer unit, said heating section, and said first cooling section.

5. A substrate processing apparatus comprising:

a cassette station including a mounting section configured to mount a substrate cassette housing a plurality of substrates thereon and a delivery unit configured to deliver the substrate from/to the substrate cassette mounted on the mounting section; and a plurality of processing stations connected to said cassette station and each configured to process the substrate transferred by said delivery unit, said processing station including:

a heating section configured to heat the substrate;

a first cooling section configured to cool the substrate heated by said heating section to a temperature not more than a first temperature;

a second cooling section configured to cool the substrate cooled by said first cooling section to a second temperature lower than the first temperature;

a substrate processing section configured to perform coating processing using a coating solution for the substrate cooled by said second cooling section; and a substrate transfer unit configured to transfer the substrate between said first cooling section, said second cooling section, and said substrate processing section, said processing station being divided into a processing block whose temperature is controlled and a transfer block, said processing block including said substrate processing section and said second cooling section, and said transfer block including said substrate transfer unit, said heating section, and said first cooling section, wherein at least one of said processing stations allows said substrate transfer unit to deliver the substrate from/to both of a substrate processing section in its own processing station and another substrate processing section in the adjacent processing station.

6. The apparatus as set forth in claim 5, wherein at least one of said processing stations includes a substrate processing section configured to perform coating processing using a resist solution for the substrate, an aligner is connectable to one of said processing stations which is positioned at a last stage when counted from said cassette station and on a side opposite to the cassette station, and a substrate processing section in said one of said processing stations performs developing processing for the substrate exposed by said aligner.

7. A substrate processing apparatus, comprising:

a heating section configured to heat a substrate;

a first cooling section configured to cool the substrate heated by said heating section to a temperature not more than a first temperature;

a second cooling section configured to cool the substrate cooled by said first cooling section to a second temperature lower than the first temperature;

a substrate processing section configured to perform coating processing of a coating solution for the substrate cooled in said second cooling section; and a first transfer unit configured to transfer the substrate between said first cooling section, said second cooling section, and said substrate processing section, wherein said substrate processing section and said second cooling section are arranged in a processing block whose temperature is controlled, and said first transfer unit, said heating section and said first cooling section are arranged in a transfer block, and said substrate processing section and said second cooling section are placed in the same atmosphere.

8. A substrate processing apparatus, comprising:

a heating section configured to heat a substrate;

a first cooling section configured to cool the substrate heated by said heating section to a temperature not more than a first temperature;

a second cooling section configured to cool the substrate cooled by said first cooling section to a second temperature lower than the first temperature;

a substrate processing section configured to perform coating processing of a coating solution for the substrate cooled in said second cooling section;

a first transfer unit configured to transfer the substrate between said first cooling section, said second cooling section, and said substrate processing section; and a dedicated second transfer unit configured to transfer the substrate between said heating section and said first cooling section, wherein said substrate processing section and said second cooling section are arranged in a processing block whose temperature is controlled, and said first transfer unit, said heating section and said first cooling section are arranged in a transfer block.

* * * * *